US009784504B2

(12) United States Patent
Tawa

(10) Patent No.: US 9,784,504 B2
(45) Date of Patent: Oct. 10, 2017

(54) RADIATOR AND METHOD FOR MANUFACTURING RADIATOR

(71) Applicant: FUJITSU LIMITED, Kawasaki-shi, Kanagawa (JP)

(72) Inventor: Fumihiro Tawa, Yokohama (JP)

(73) Assignee: FUJITSU LIMITED, Kawasaki (JP)

(*) Notice: Subject to any disclaimer, the term of this patent is extended or adjusted under 35 U.S.C. 154(b) by 508 days.

(21) Appl. No.: 14/324,413

(22) Filed: Jul. 7, 2014

(65) Prior Publication Data
US 2015/0060027 A1 Mar. 5, 2015

(30) Foreign Application Priority Data
Aug. 30, 2013 (JP) ................. 2013-179335

(51) Int. Cl.
| | |
|---|---|
| *F28D 1/047* | (2006.01) |
| *F28F 9/18* | (2006.01) |
| *F28F 1/02* | (2006.01) |
| *H01L 23/473* | (2006.01) |
| *B21D 53/02* | (2006.01) |

(Continued)

(52) U.S. Cl.
CPC ........... *F28D 1/0476* (2013.01); *B21D 53/02* (2013.01); *F28D 1/0471* (2013.01); *F28F 1/022* (2013.01);
(Continued)

(58) Field of Classification Search
CPC .. F28F 1/025; F28F 1/022; F28F 1/045; F28F 1/12; F28F 9/182; F28F 2255/16;
(Continued)

(56) References Cited

U.S. PATENT DOCUMENTS 5,186,250 A * 2/1993 Ouchi ................... F28D 1/0316
165/152
5,251,692 A * 10/1993 Haussmann ........ F28D 1/05383
165/152

(Continued)

FOREIGN PATENT DOCUMENTS

DE 698 13 917 T2 3/2004
DE 10 2011 008 118 A1 7/2012

(Continued)

OTHER PUBLICATIONS

European Search Report application No. 14176281.5 dated Feb. 3, 2015.

(Continued)

*Primary Examiner* — Tho V Duong
(74) *Attorney, Agent, or Firm* — Squire Patton Boggs (US) LLP

(57) ABSTRACT

A radiator includes a tube that has a flattened-shape, the tube including an internal flow channel that allows a coolant to flow through the internal flow channel; and a tank that includes an insertion port into which a joint end portion of the tube is inserted so that the tank and the tube are joined to each other, wherein the tube includes an outer-peripheral-wall extending in a direction perpendicular to a thickness direction of the tube, and bend depressions that are bent toward the internal flow channel in a concave shape are formed in at least a region of the outer-peripheral-wall adjacent to the joint end portion, the bend depressions extending along the internal flow channel, and the bend depressions are deformed in a width direction of the tube so that the width of the joint end portion is the same as the width of the insertion port.

6 Claims, 15 Drawing Sheets

(51) Int. Cl.
*F28F 1/04* (2006.01)
*F28F 1/12* (2006.01)
*F28D 21/00* (2006.01)
*F28F 9/02* (2006.01)

(52) U.S. Cl.
CPC .............. *F28F 1/025* (2013.01); *F28F 1/045* (2013.01); *F28F 1/12* (2013.01); *F28F 9/182* (2013.01); *H01L 23/473* (2013.01); *F28D 2021/0031* (2013.01); *F28F 1/126* (2013.01); *F28F 9/0202* (2013.01); *F28F 2255/16* (2013.01); *H01L 2924/0002* (2013.01); *Y10T 29/49378* (2015.01)

(58) Field of Classification Search
CPC ........ F28F 1/126; F28F 9/0202; B21D 53/08; B21D 53/02; B21D 5/12; B21D 5/10; B21D 5/015; H01L 23/473; H01L 2924/0002; F28D 1/0471; F28D 1/0476; F28D 2021/0031; Y10T 29/49378
USPC .................................................. 29/890.05, 38
See application file for complete search history.

(56) References Cited

U.S. PATENT DOCUMENTS

| | | | | |
|---|---|---|---|---|
| 5,979,051 A * | 11/1999 | Kato | ........................ | B21C 37/28 165/174 |
| 6,209,202 B1 * | 4/2001 | Rhodes | ................. | B21C 37/151 165/177 |
| 6,289,981 B1 * | 9/2001 | Tokizaki | ............. | F28D 1/05391 165/110 |
| 6,799,630 B1 * | 10/2004 | Kato | .................... | B23K 1/0012 165/170 |
| 6,988,539 B2 * | 1/2006 | Kato | .................... | B23K 1/0012 165/133 |
| 7,143,824 B2 * | 12/2006 | Emrich | ................. | F28D 1/0391 165/178 |
| 2005/0092476 A1 * | 5/2005 | Hu | .......................... | F28F 1/022 165/177 |
| 2005/0257923 A1 * | 11/2005 | Alley | ..................... | F28F 9/182 165/173 |

FOREIGN PATENT DOCUMENTS

| | | |
|---|---|---|
| EP | 0 854 342 A2 | 7/1998 |
| JP | 10-122778 A | 5/1998 |
| WO | WO 99/46544 A1 | 9/1999 |

OTHER PUBLICATIONS

Japanese Office Action dated Mar. 28, 2017, issued in corresponding JP Application No. 2013-179335. (English Language Machine Translation attached).

* cited by examiner

RADIATOR AND METHOD FOR MANUFACTURING RADIATOR

CROSS-REFERENCE TO RELATED APPLICATION

This application is based upon and claims the benefit of priority of the prior Japanese Patent Application No. 2013-179335, filed on Aug. 30, 2013, the entire contents of which are incorporated herein by reference.

FIELD

The embodiments discussed herein are related to a radiator and a method for manufacturing a radiator.

BACKGROUND

There have been developed a variety of cooling units that cool a heat generating part such as a central processing unit (CPU) in an electronic apparatus, for example, a server. For example, there has been developed a cooling unit that circulates cooling liquid in a circulation channel using a pump. The cooling liquid or coolant absorbs heat generated by heat generating parts through cooling jackets mounted on the heat generating parts and dissipates the heat through a radiator. In this manner, the cooling unit cools the cooling fluid.

In addition, there has been developed a coolant distributor that allows coolant to flow into a flow channel from an inlet pipe on one side and flow out of an outlet pipe on the other side, refer to, for example, International Publication Pamphlet No. WO 99/46544. In the coolant distributor, the width of the flow channel gradually expands from the inlet pipe to the outlet pipe.

FIG. 1 illustrates an existing radiator 100. The existing radiator 100 includes a tank 110 having a supply chamber and a collection chamber (neither is illustrated) partitioned in the internal space and a loop channel tube 120 having an internal coolant channel therein. As illustrated in FIG. 1, the loop channel tube 120 of the existing radiator 100 is flat in shape. Four channel tubes 120 are provided on each of both sides of the tank 110. That is, eight channel tubes 120 are joined to the tank 110 in total. Each of the channel tubes 120 includes a pair of counterflow channel units 122 that face each other with a folded portion 121 therebetween. In the folded portion 121, the channel tube 120 is folded in a U shape. A corrugated fin 123, which is a corrugated plate, is fusion-bonded between the two counterflow channel units 122 that face each other.

In addition, the tank 110 includes an inlet nozzle 111 that communicates with a collection chamber formed therein and an ejection nozzle 112 that communicates a supply chamber formed therein. A hose (not illustrated) for transporting coolant is attached to each of the inlet nozzle 111 and the ejection nozzle 112. The counterflow channel units 122 of the channel tube 120 are disposed so as to face each other. The corrugated fin 123, which is a corrugated plate, is fixed between the two counterflow channel units 122.

In general, the channel tube 120 is connected to the tank 110 by brazing. As illustrated in FIG. 1, an insertion port 113 having a slit shape is formed in a side surface of the tank 110. The insertion port 113 allows both the ends of the channel tube 120 to be inserted thereinto. The end of one of the counterflow channel units 122 is inserted into the supply chamber of the tank 110, and the end of the other counterflow channel unit 122 is inserted into the collection chamber of the tank 110. Thereafter, the channel tube 120 is connected to the tank 110 by brazing.

The coolant of the radiator 100 flows into the tank 110 through the inlet nozzle 111. Thereafter, the coolant flows from the collection chamber of the tank 110 to the ejection nozzle 112 via the channel tube 120 and the supply chamber of the tank 110. When the coolant flows in the internal channel of the channel tube 120, the heat of the coolant dissipates from the corrugated fin 123. In this manner, the coolant is cooled. Note that such a cooling unit has a blower fan that sends air to the radiator. Thus, dissipation of heat from the corrugated fin 123 is facilitated by the air sent from the blower fan.

SUMMARY

According to an aspect of the invention, a radiator includes a tube that has a flattened shape, the tube including an internal flow channel that allows a coolant to flow through the internal flow channel; and a tank that includes an insertion port into which a joint end portion of the tube is inserted so that the tank and the tube are joined to each other, wherein the tube includes an outer peripheral wall extending in a direction perpendicular to a thickness direction of the tube, and one or more bend depressions that are bent toward the internal flow channel in a concave shape are formed in at least a region of the outer peripheral wall adjacent to the joint end portion, the one or more bend depressions extending along the internal flow channel, and wherein the one or more bend depressions are deformed in a width direction of the tube so that the width of the joint end portion is the same as the width of the insertion port.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 13A illustrates the channel tube before the channel tube is subjected to the drawing, FIG. 13B illustrates the channel tube during the drawing, and FIG. 13C illustrates the channel tube after the channel tube is subjected to the drawing;

DESCRIPTION OF EMBODIMENTS

Figure 1:
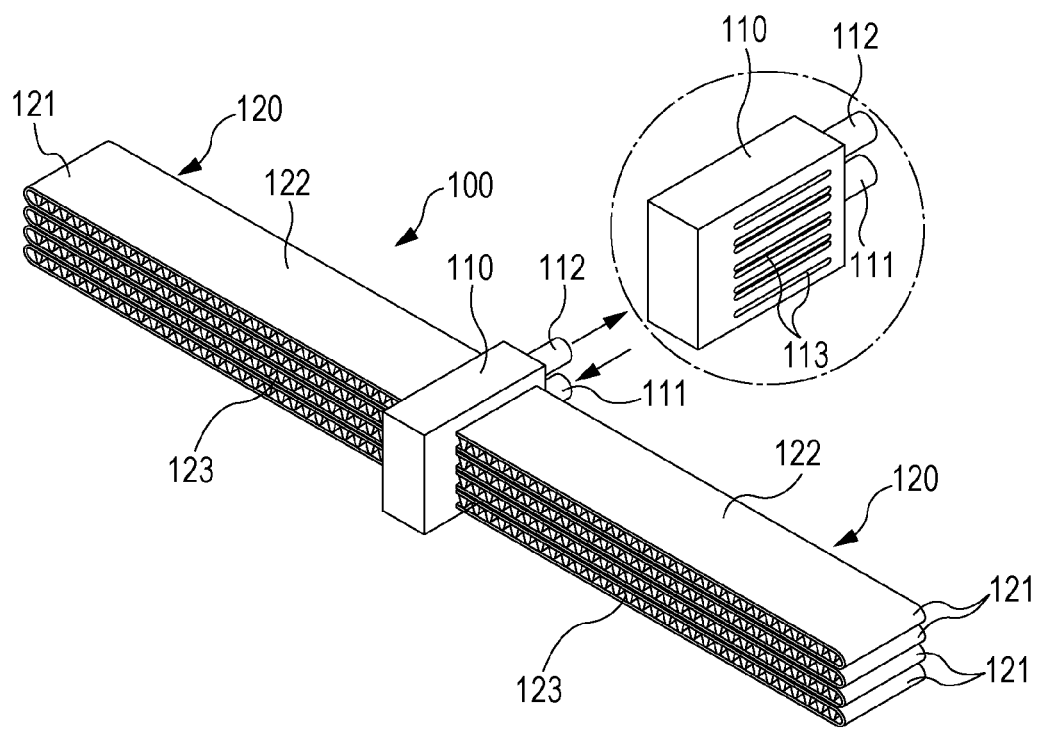
FIG. 1 illustrates an existing radiator.

In the existing radiator, the radiation performance of the radiator 100 increases with increasing radiation area. The radiation area of the radiator 100 varies in accordance with, for example, the height, width, and depth of the channel tube 120 and the fin density of the corrugated fin 123. Hereinafter, the width of the channel tube 120 is discussed. In general, it is desirable that the width of the channel tube 120 be the same as the width of the insertion port 113 of the tank 110. That is, the width of the channel tube 120 is determined by the width of the insertion port 113 of the tank 110. Accordingly, it is difficult to increase the radiation area of the radiator 100 by increasing the width of the channel tube 120 to greater than the width of the insertion port 113 of the tank 110. In addition, if an adaptor described in International Publication Pamphlet No. WO 99/46544 is disposed between the tank 110 and the channel tube 120, the number of parts increases and, therefore, the manufacturing cost may increase.

Accordingly, it is desired to provide a sufficient radiation area by increasing the width of a channel tube joined to a tank of a radiator without increasing the number of parts.

A radiator and a method for manufacturing the radiator according to exemplary embodiments are described in detail below with reference to the accompanying drawings.

First Exemplary Embodiment

Figure 2:
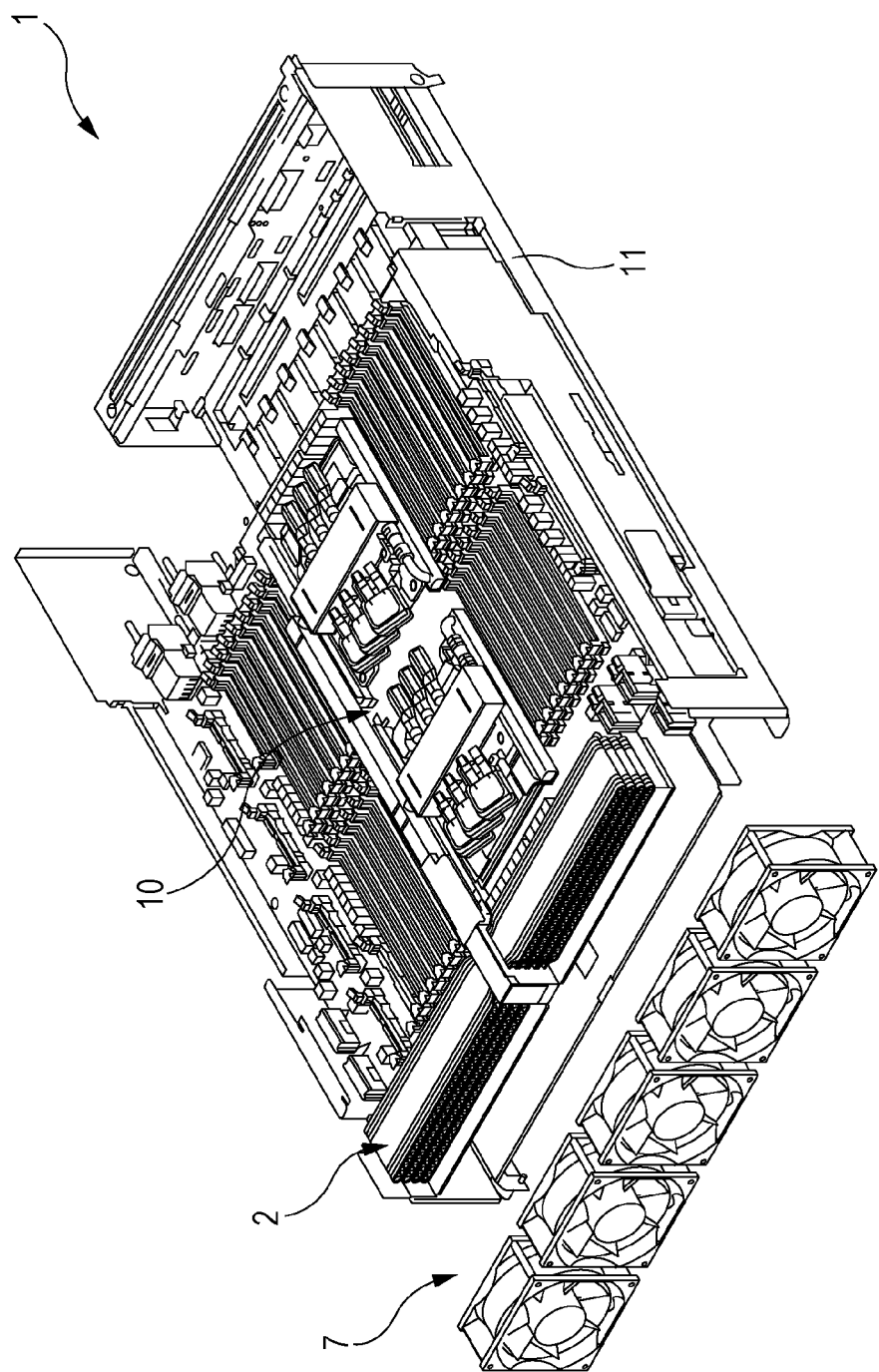
FIG. 2 is a perspective view of an electronic apparatus according to a first exemplary embodiment.

FIG. 2 is a perspective view of an electronic apparatus 1 according to a first exemplary embodiment. As illustrated in FIG. 2, the electronic apparatus 1 is an information processing apparatus, such as a server. Alternatively, the electronic apparatus 1 may be another information processing apparatus. The electronic apparatus 1 includes a housing 11. The housing 11 includes a mother board (a circuit board) including a plurality of central processing units (CPUs) thereon. The CPU is a device that performs a variety of computations. The CPU is an electronic component that generates heat (a heat generating part) when power is supplied. The mother board is a base plate or substrate including a variety of circuits mounted thereon. The circuits provides functions so that the electronic apparatus 1 may function as a server. The electronic apparatus 1 includes a cooling unit 10 of a water-cooling type in order to cool the CPUs acting as heat generating parts.

Figure 3:
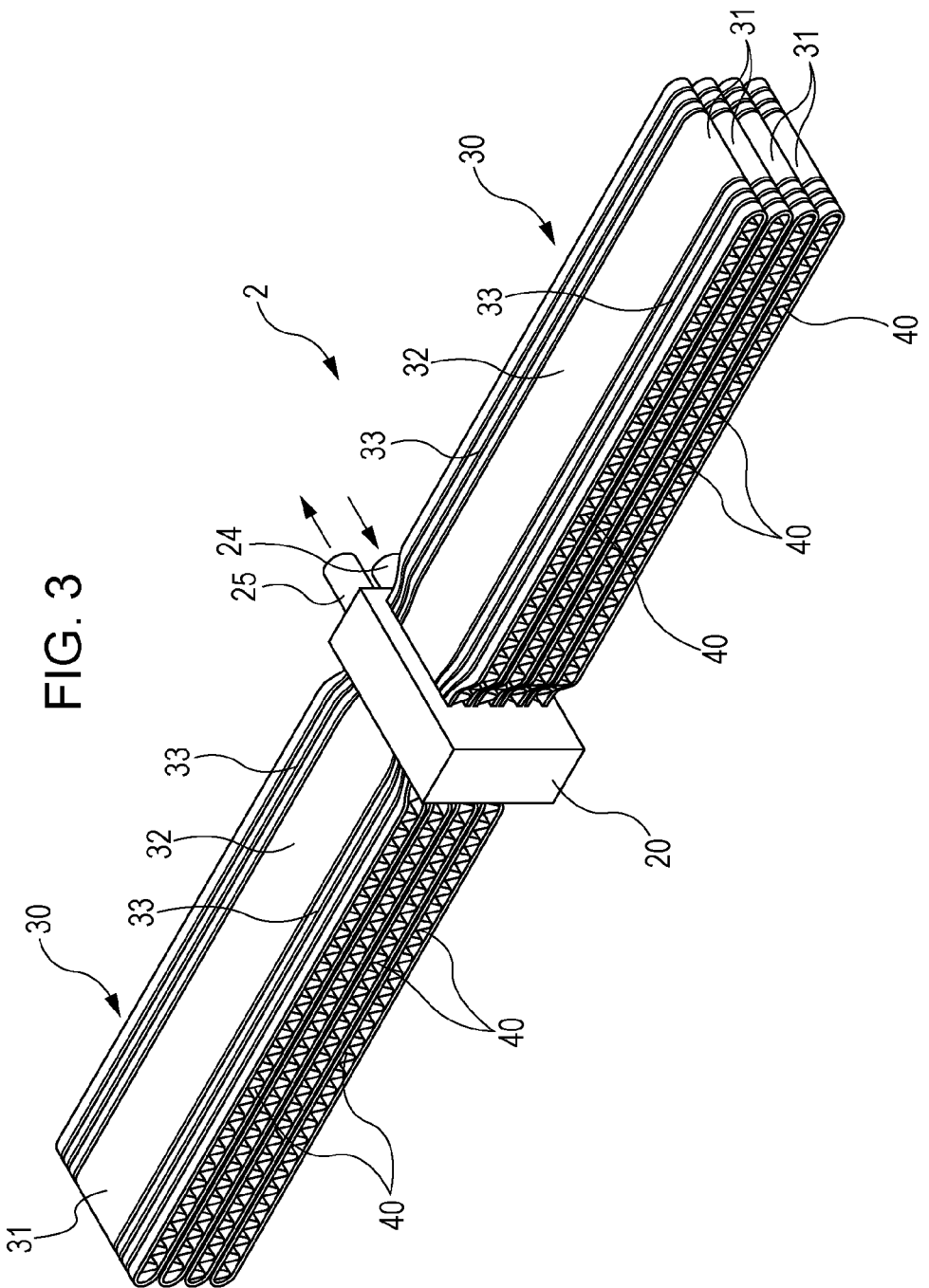
FIG. 3 is a perspective view of a radiator according to the first exemplary embodiment.
Figure 4:
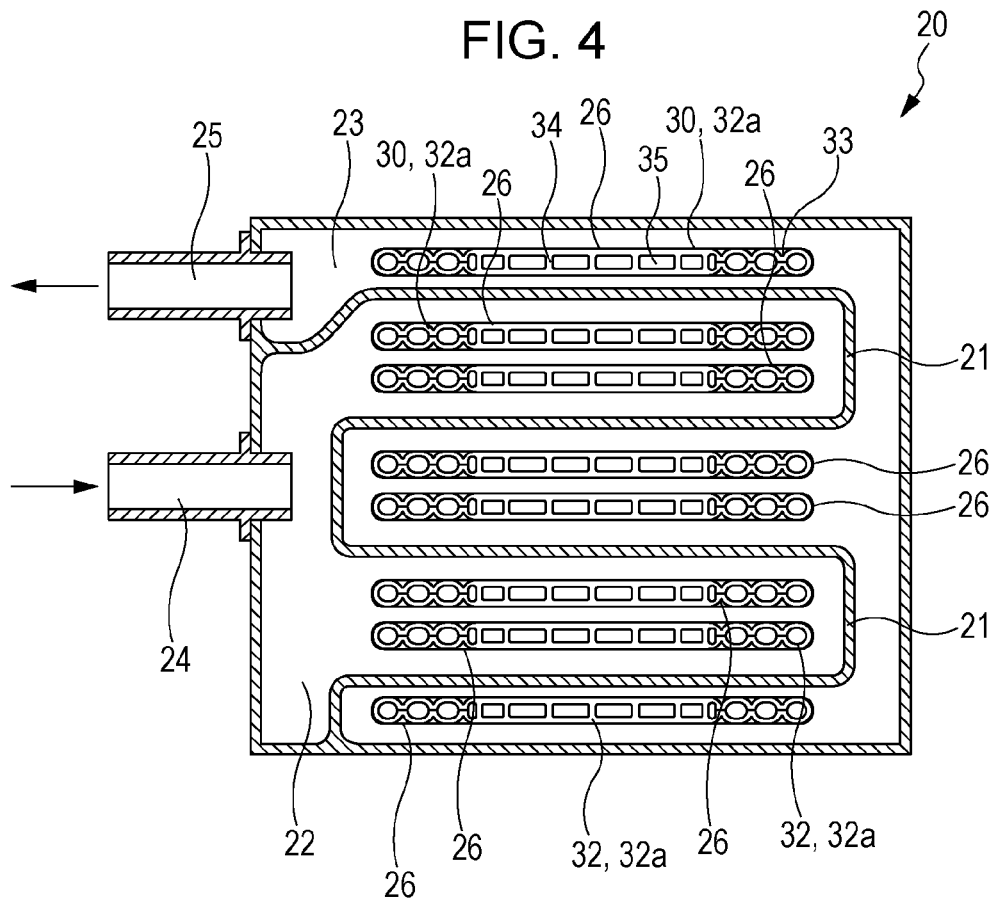
FIG. 4 is a longitudinal cross-sectional view of the radiator according to the first exemplary embodiment.
Figure 5:
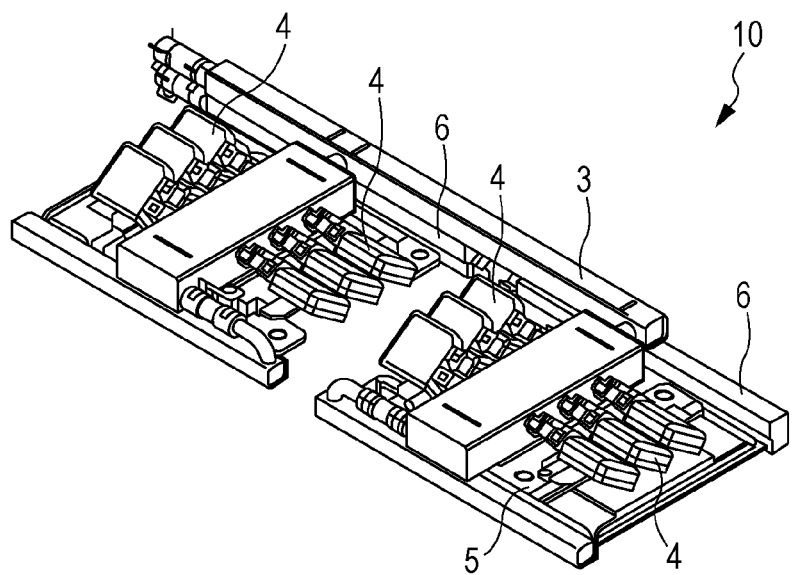
FIG. 5 illustrates the structure of a cooling unit according to the first exemplary embodiment.

FIG. 3 is a perspective view of a radiator according to the first exemplary embodiment. FIG. 4 is a longitudinal cross-sectional view of the radiator according to the first exemplary embodiment. FIG. 5 illustrates the structure of the cooling unit 10 according to the first exemplary embodiment. More specifically, FIG. 5 illustrates a main structure of the cooling unit 10 other than a radiator 2. The cooling unit 10 includes the radiator 2, a supply pipe 3, a pump 4, a heat receiving plate 5, a return pipe 6, and a blower fan 7. The blower fan 7 sends air forcibly to the interior of the housing 11. The radiator 2, the supply pipe 3, the pump 4, the heat receiving plate 5, and the return pipe 6 are coupled so as to form a closed loop in the cooling unit 10. In this manner, a circulation path is formed. The circulation path allows cooling fluid serving as a coolant for cooling the CPUs to circulate therethrough. By causing the cooling fluid to absorb the heat generated by the CPUs, the cooling unit 10 may cool the CPUs. An example of the cooling fluid is antifreeze propylene glycol series liquid. Note that the cooling fluid is not limited thereto. For example, water may be employed as the cooling fluid.

The heat receiving plate 5 is a module for removing heat away from the CPUs. The heat receiving plate 5 is disposed so as to be in thermal contact with the CPUs. The pump 4 is, for example, an electrically-operated pump. The pump 4 serves as a power source for circulating the cooling fluid through the circulation path of the cooling unit 10. The heat receiving plate 5 serves as a cooling jacket including an internal flow channel that allows the cooling fluid to flow therethrough. The heat receiving plate 5 causes the cooling fluid flowing through the internal flow channel to absorb the heat generated by the CPUs.

The radiator 2 dissipates the heat recovered via the return pipe 6 to air so as to cool the cooling fluid. Thereafter, the radiator 2 delivers the cooled cooling fluid to the supply pipe 3. The radiator 2 includes a tank 20, a flat channel tube 30, and a corrugated fin 40, which is a corrugated radiator plate. According to the present exemplary embodiment, the tank 20 and the channel tube 30 are made of aluminum. However, the tank 20 and the flat channel tube 30 may be made of a metal material other than aluminum. The channel tube 30 is integrally molded by extrusion molding so that a plurality of internal flow channels are formed therein.

The inner space of the tank 20 is partitioned into a collection chamber 22 and a supply chamber 23 by a partition wall 21. The tank 20 includes an inlet nozzle 24 and an exhaust nozzle 25 in the front surface thereof. The inlet nozzle 24 communicates with the collection chamber 22 of the tank 20. The return pipe 6 is connected to the inlet nozzle 24. In contrast, the exhaust nozzle 25 communicates with the supply chamber 23 of the tank 20. The supply pipe 3 is connected to the exhaust nozzle 25.

Four channel tubes 30 are provided on each of both sides of the tank 20. Each of the channel tubes 30 is bent in a U shape in the middle in the length direction thereof. Thus, the channel tube 30 includes a loop shape. The corrugated fin 40 is disposed between the two portions formed by the bend. More specifically, a U-shaped bend portion 31 is formed in the middle of the length of the channel tube 30. Thus, a pair of counterflow channel units 32, one of which is located on one side of the bend portion 31 and the other is located on the other side, is formed, and the counterflow channel units 32 are disposed so as to face each other. In each of the channel tubes 30, one end of the pair of the counterflow channel units 32 is connected to the collection chamber 22 of the tank 20, and the other end is connected to the supply chamber 23 of the tank 20. In addition, in each of the channel tubes 30, the corrugated fin 40 is fusion-bonded to the surfaces of the counterflow channel units 32 that face each other.

In the radiator 2, the collection chamber 22 of the tank 20 collects the cooling fluid returned via the return pipe 6 through the inlet nozzle 24. In the cooling unit 10, since the cooling fluid collected from the return pipe 6 into the radiator 2 has absorbed the heat of the CPUs, the temperature of the cooling fluid is high. The high-temperature cooling fluid collected in the collection chamber 22 of the tank 20 is distributed to the channel tubes 30. At that time, the heat is dissipated from the corrugated fins 40 when the cooling fluid flows through the internal channel of each of the channel tubes 30. In this manner, the cooling fluid is cooled. The cooling fluid cooled by the channel tubes 30 flows into the supply chamber 23 of the tank 20. Thereafter, the cooling fluid is pumped from the exhaust nozzle 25 to the supply pipe 3 so as to be used for cooling the CPUs again.

As illustrated in FIG. 3, a portion of the channel tube 30 in the vicinity of a joint end portion, which is joined to a side surface of the tank 20, is subjected to drawing and, thus, is narrower than the other portion in the width direction. As used herein, the width of the channel tube 30 is defined as the dimension of the channel tube 30 in a direction perpendicular to the length direction of the channel tubes 30, that is, a direction in which the internal flow channel extends. The structure of the channel tube 30 and a method for manufacturing the channel tube 30 are described in detail below.

Figure 6:
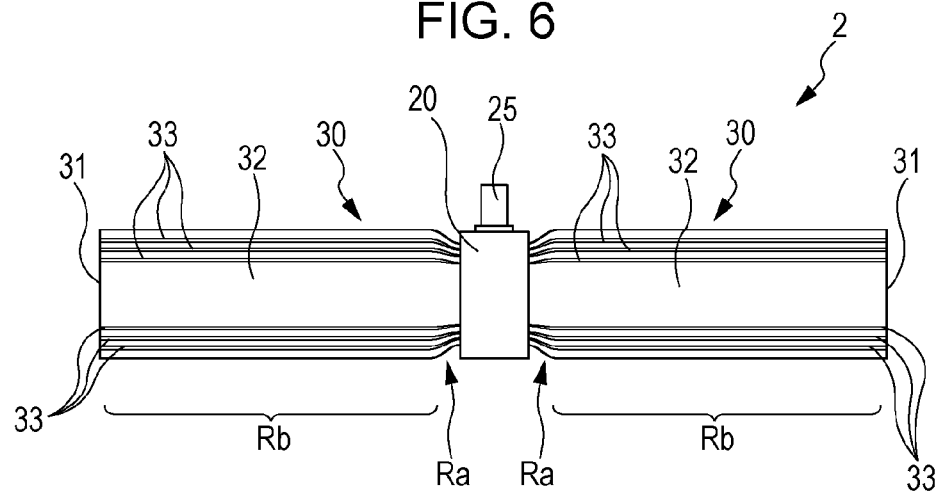
FIG. 6 is a plan view of the radiator according to the first exemplary embodiment.
Figure 7:
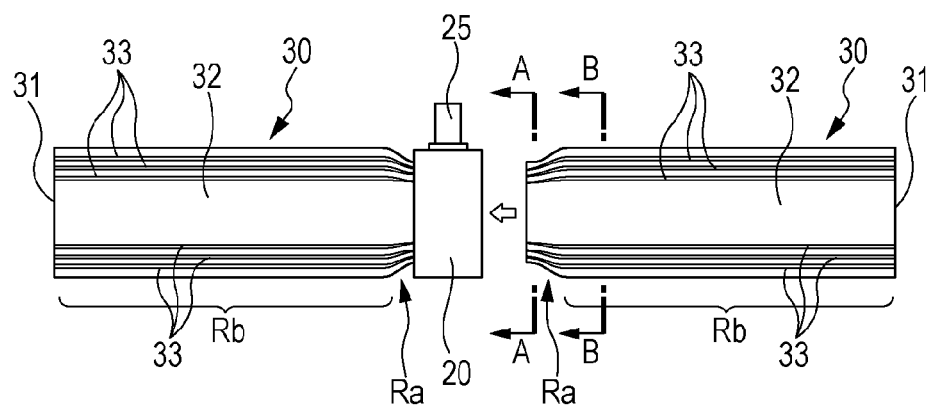
FIG. 7 is an exploded view of the radiator according to the first exemplary embodiment.

FIG. 6 is a plan view of the radiator 2 according to the first exemplary embodiment. FIG. 7 is an exploded view of the radiator 2 according to the first exemplary embodiment. FIG. 7 illustrates the tank 20 and the channel tube 30 before the channel tube 30 is joined to one of the two side surfaces of the tank 20. A plurality of insertion ports 26 are formed in each of the two side surfaces of the tank 20 (refer to FIG. 4). The counterflow channel unit 32 of each of the channel tubes 30 includes a joint top end 32a. To manufacture the radiator 2, the joint top end 32a of the pair of the counterflow channel units 32 is inserted into an insertion port 26 formed in a side surface of the tank 20 and is subjected to brazing (described in more detail below). In this manner, the channel tube 30 is joined to the tank 20. In addition, since a gap formed between the insertion port 26 of the tank 20 and the joint top end 32a is filled with a brazing material, the liquid tightness of the tank 20 may be ensured.

As illustrated in FIGS. 6 and 7, the joint top end 32a and its vicinity (hereinafter referred to as a "joint end region Ra") of the channel tube 30 of the radiator 2 is narrower than the other portion (hereinafter referred to as a "general region Rb") in the width direction. That is, the general region Rb of the channel tube 30 is wider than the joint end region Ra. FIGS. 8A to 8E illustrate a manufacturing steps of the channel tube 30. In a molding step illustrated in FIG. 8A, the channel tube 30 is integrally formed by extrusion molding. During the molding step, the channel tube 30 is extrusion-molded so as to have the width of the general region Rb. Note that the channel tube 30 may be molded using an aluminum brazing sheet in which a brazing material is stacked on aluminum.

Figure 8A:
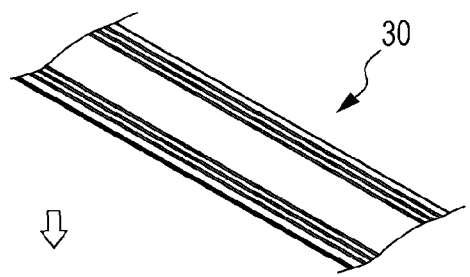
FIGS. 8A to 8E illustrate the steps for manufacturing a channel tube according to the first exemplary embodiment.
Figure 8B:
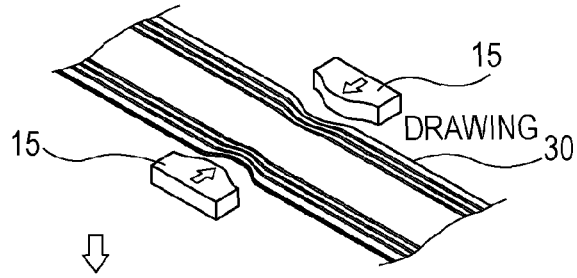
Figure 8C:
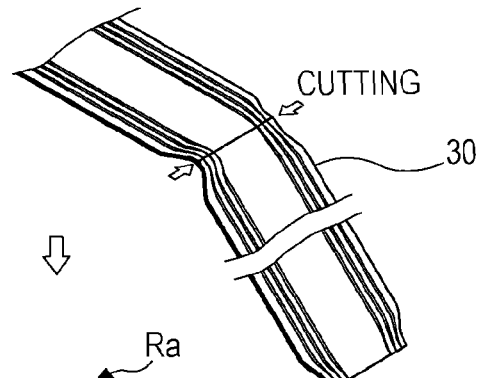
Figure 8D:
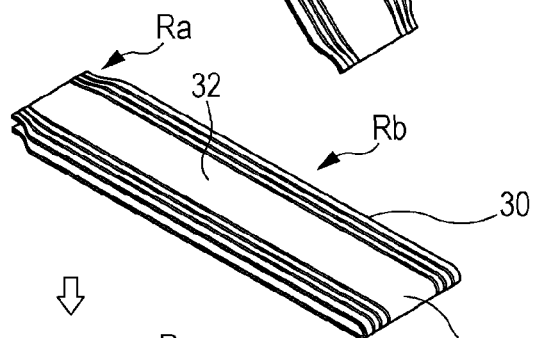

Subsequently, in a drawing step illustrated in FIG. 8B, a narrow portion of the channel tube 30 is formed at a position at which the joint end region Ra is to be formed through a machining process using a zig 15. That is, by drawing, the width of the joint top end 32a of the channel tube 30 (the counterflow channel unit 32) is made to be the same as the width of the insertion port 26 of the tank 20. Thereafter, the channel tube 30 is cut into a predetermined or certain length (refer to FIG. 8C). After cutting, the channel tube 30 is bent into a U shape (refer to FIG. 8D). Note that the portion of the channel tube 30 having the width decreased by drawing serves as the joint end region Ra of the channel tube 30.

Figure 8E:
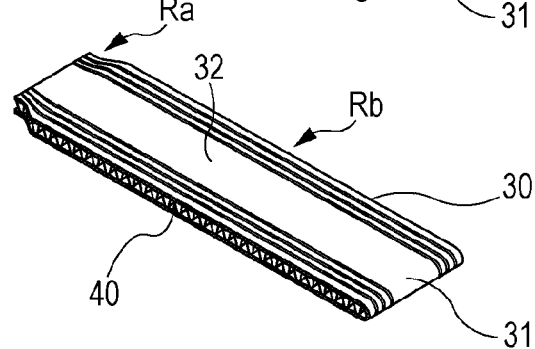

Through the above-described steps, a flat channel tube 30 having a rolled brazing material (a pressure-bonded brazing material) thereon may be achieved. Subsequently, as illustrated in FIG. 8E, the corrugated fin 40 is disposed between the two counterflow channel units 32 of the channel tube 30. The joint top end 32a of the channel tube 30 is inserted into the insertion port 26 of the tank 20 prepared separately and is temporarily fixed. Thereafter, a brazing material is applied to a gap formed between the insertion port 26 of the tank 20 and the joint top end 32a of the channel tube 30. A temporarily assembled product including the temporarily fixed counterflow channel unit 32 is subjected to brazing in an oven. In this manner, the brazing material pressure-bonded and applied to the channel tube 30 is melted. Thus, the channel tube 30 is joined to the corrugated fin 40, and the channel tube 30 is joined to the tank 20. As a result, the radiator 2 illustrated in FIG. 3 may be achieved. Note that when the channel tube 30 is joined to the tank 20, the brazing material is allowed to flow into the interior of the tank 20 by applying the brazing material to a connection portion between the channel tube 30 and the tank 20. Accordingly, a sufficient rupture strength of the radiator 2 may be ensured. In addition, the liquid tightness of the tank 20 may be increased.

Figure 9:
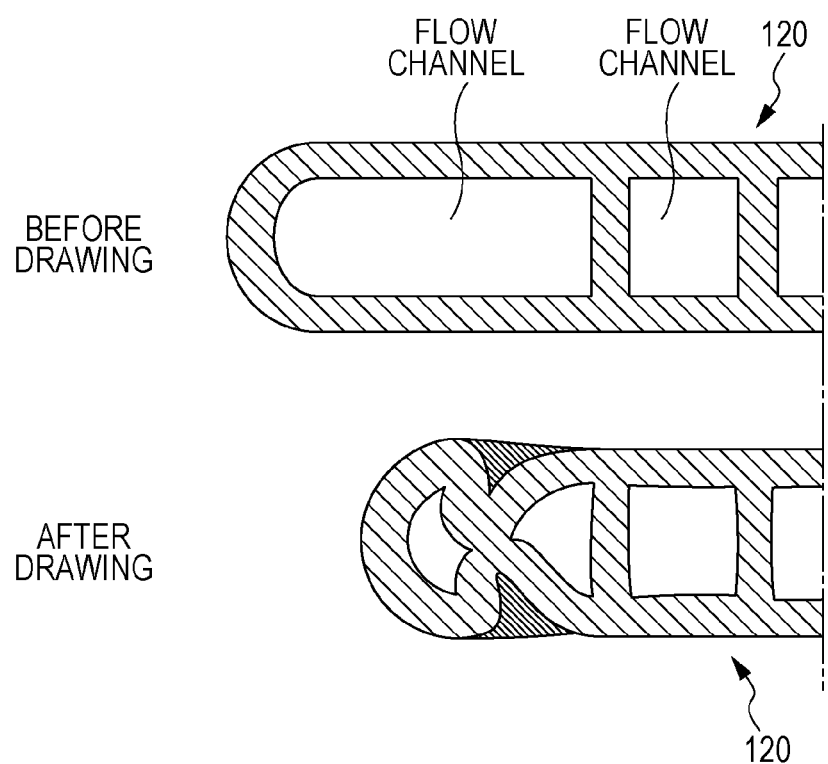
FIG. 9 illustrates an existing channel tube before and after the channel tube is subjected to drawing.

The case in which an existing channel tube 120 including a plurality of internal flow channels that allow the cooling fluid to flow therethrough is subjected to drawing is discussed below. FIG. 9 illustrates an existing channel tube 120 before and after the channel tube 120 is subjected to drawing. The upper section of FIG. 9 illustrates the channel tube 120 before the channel tube 120 is subjected to drawing, and the lower section of FIG. 9 illustrates the channel tube 120 after the channel tube 120 is subjected to drawing. When a compressing force is exerted on an existing channel tube 120 from the sides through a machining process in such a direction that the width of the channel tube 120 is reduced, a portion having a low material strength, which is located at an unexpected position, easily collapses. As a result, it is difficult to fill a gap between the joint end portion of the channel tube and the insertion port of the tank using the brazing material. Thus, the coolant may leak out. In addition, it may be difficult to distribute the coolant from the tank to the channel tube.

Figure 10:
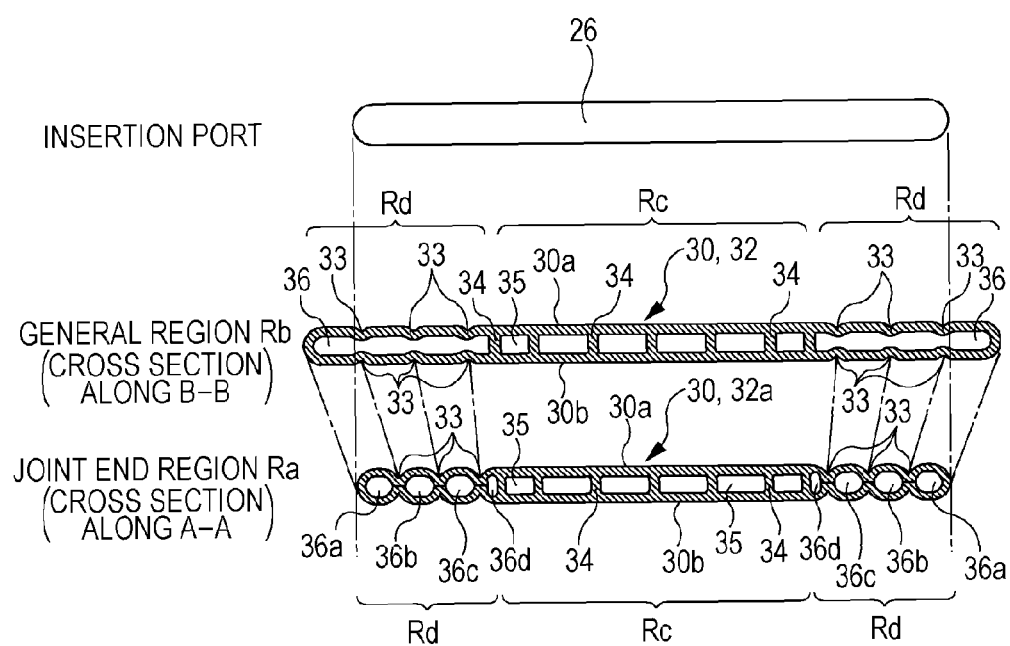
FIG. 10 is a vertical cross-sectional view of the channel tube according to the first exemplary embodiment.
Figure 11:
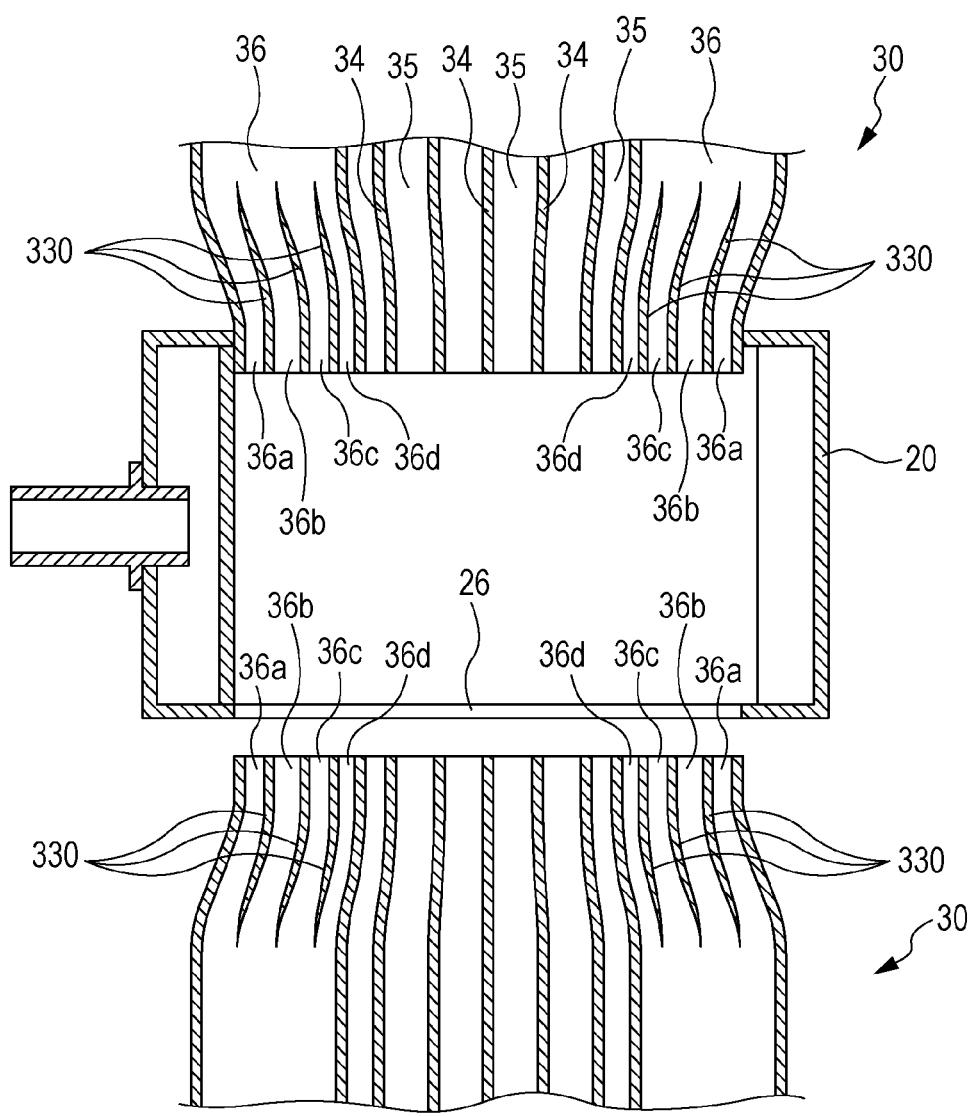
FIG. 11 is a horizontal sectional view of the channel tube according to the first exemplary embodiment.

Therefore, according to the present exemplary embodiment, a bend depression 33 that is bent toward the internal flow channel so as to include a concave shape (a groove-like depression) is formed so as to extend in a direction in which the internal flow channel extends (the length direction of the channel tube 30). The bend depression 33 is described in detail below. FIG. 10 is a vertical cross-sectional view of the channel tube 30 according to the first exemplary embodiment. FIG. 11 is a horizontal sectional view of the channel tube 30 according to the first exemplary embodiment. The lower section of FIG. 10 illustrates a vertical cross-sectional structure of the joint end region Ra taken along a line A-A of FIG. 7. The upper section of FIG. 10 illustrates a vertical cross-sectional structure of the general region Rb taken along a line B-B of FIG. 7. Note that FIG. 10 also illustrates the insertion port 26 formed in the side surface of the tank 20. In addition, the horizontal sectional view of FIG. 11 indicates the cross-sectional structure of the channel tube 30 at a height of the middle of the channel tube 30 in the depth or thickness direction.

As illustrated in FIG. 11, the width of the general region Rb of the channel tube 30 is greater than the width of the insertion port 26. In contrast, the width of the joint end region Ra of the channel tube 30 is less than the width of the general region Rb. The width of the joint top end 32a is the same as the width of the insertion port 26. Note that an upper wall 30a and a lower wall 30b of the channel tube 30 are illustrated in FIG. 10. The upper wall 30a and the lower wall 30b are two outer peripheral walls extending in a direction perpendicular to the thickness direction of the channel tube 30. The upper wall 30a and the lower wall 30b are examples of an outer peripheral wall of the tube. In addition, partition walls 34 are also illustrated in FIG. 10. The partition walls 34 connect the upper wall 30a to the lower wall 30b of the channel tube 30 and partition the inner space of the channel tube 30 into a plurality of internal flow channels. The partition walls 34 are disposed in a region Rc in the width direction of the channel tube 30. Hereinafter, the region Rc is referred to as a "partition wall installation region". The partition wall installation regions Rc for the joint end region Ra and the general region Rb include the same structure. Internal flow channels 35 are formed by the partition walls 34 that partition the inner space of the channel tube 30.

Figure 12:
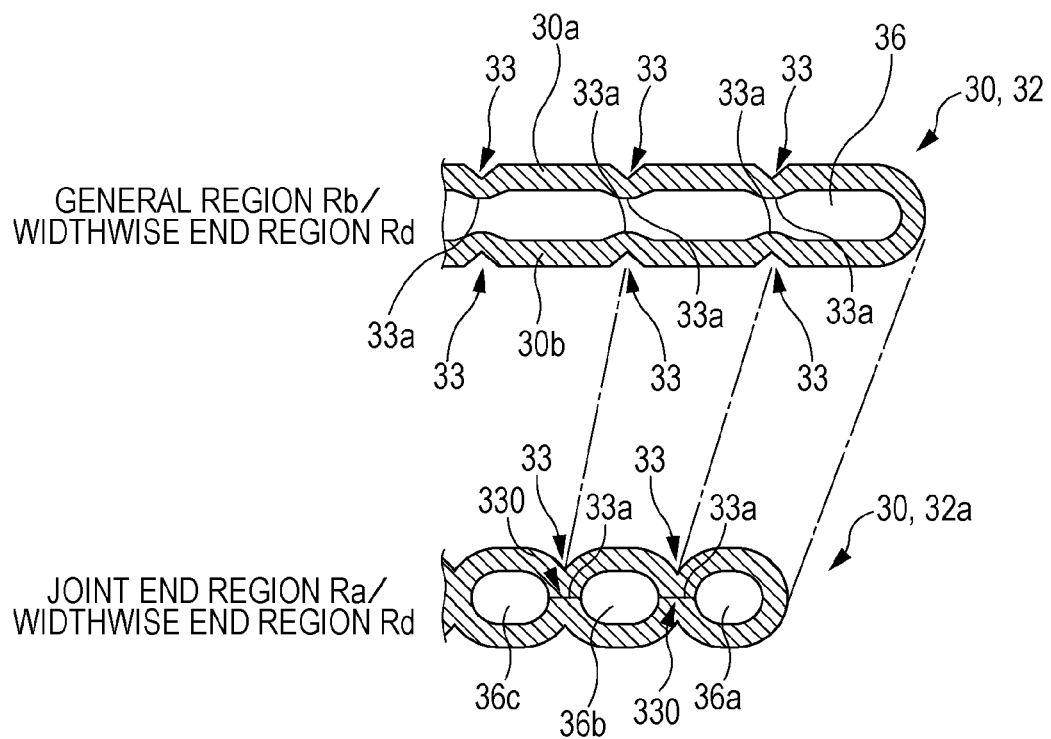
FIG. 12 is an enlarged view of a widthwise end region of the channel tube according to the first exemplary embodiment.

As illustrated in FIG. 10, each of the bend depressions 33 of the channel tube 30 has a substantially V shape in the cross section. In an example illustrated in FIG. 10, the bend depressions 33 are formed in each of regions Rd, which is an end region of the channel tube 30 in the width direction of the channel tube 30. Hereinafter, the region Rd is referred to as a "widthwise end region". FIG. 12 is an enlarged view of the widthwise end region Rd of the vertical cross section of the channel tube 30 illustrated in FIG. 10. The bend depressions 33 are provided in each of the two widthwise end regions Rd located on both sides of the partition wall installation regions Rc. More specifically, the bend depressions 33 are provided in each of the upper wall 30a and the lower wall 30b so that the two bend depressions 33 face each other. In addition, the bend depression 33 includes a top end protrusion 33a at the top end. The channel tube 30 includes an internal flow channel 36 formed in the widthwise end region Rd. The top end protrusion 33a is a top end portion of the bend depression 33 protruding toward the internal flow channel 36.

Figure 13:
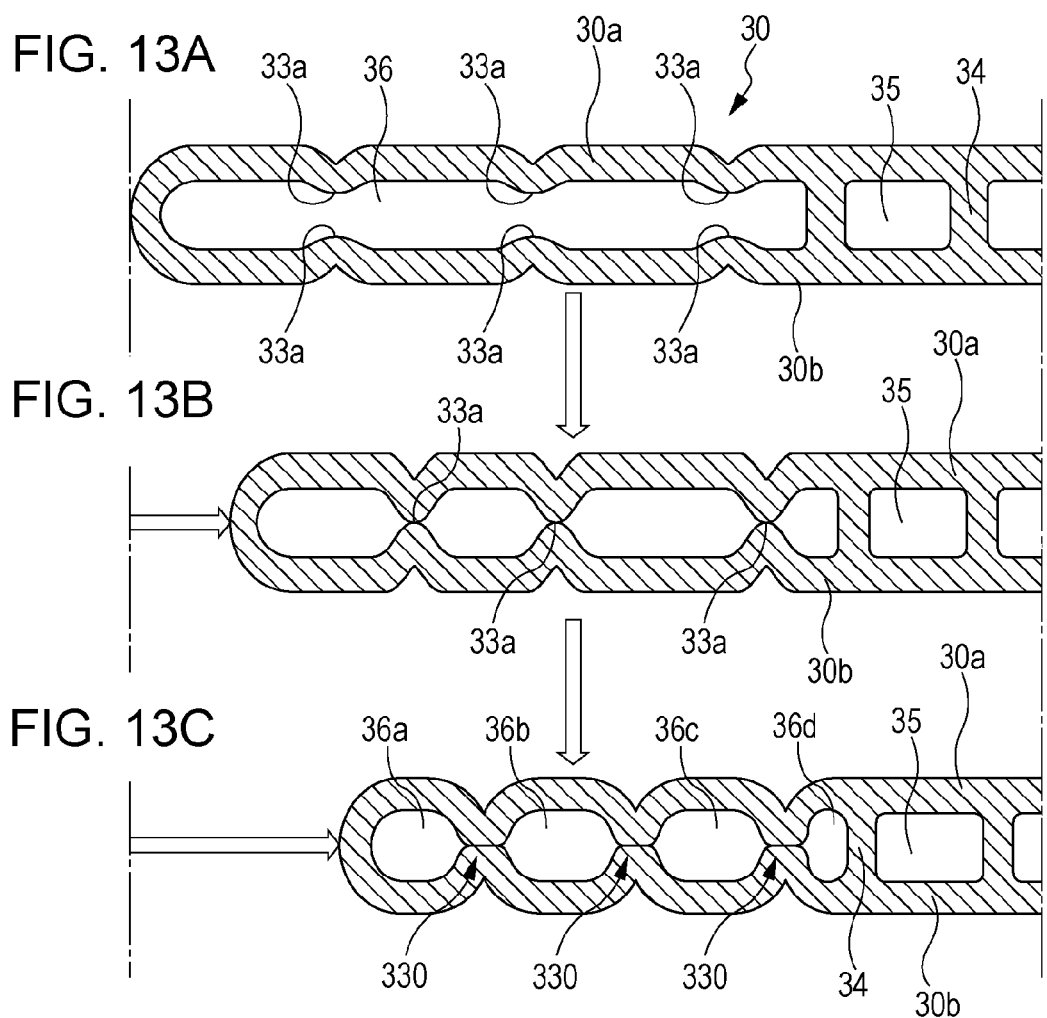
FIGS. 13A to 13C illustrate deformation of the channel tube occurring when the channel tube is subjected to drawing, according to the first exemplary embodiment, where

FIGS. 13A to 13C illustrate deformation of the channel tube 30 occurring when the channel tube 30 is subjected to drawing, according to the first exemplary embodiment. The channel tube 30 before the drawing is illustrated in FIG. 13A. The channel tube 30 being subjected to the drawing is illustrated in FIG. 13B. The channel tube 30 after the channel tube 30 is subjected to the drawing is illustrated in FIG. 13C. When a compressing force is exerted on the channel tube 30 inwardly from both sides of the channel tube 30 in the width direction, the compressing force acts on the bend depressions 33 formed in the upper wall 30a and the lower wall 30b of the channel tube 30. At that time, since the bend depressions 33 have a substantially V shape in a cross section perpendicular to the length direction of the channel tube 30, the bend depressions 33 are more easily collapsed by the compressing force in the width direction than the other portion. Accordingly, as illustrated in FIGS. 13B and 13C, in the drawing, the bend depressions 33 formed in the widthwise end region Rd may be primarily crushed (squashed).

As the bend depressions 33 are gradually crushed toward the inside of the channel tube 30 in the width direction, the angle of the V shape formed by each of the bend depressions 33 gradually decreases (to an acute angle). Thus, the top end protrusions 33a each is displaced toward the inside of the channel tube 30. The two bend depressions 33 formed in the upper wall 30a and the lower wall 30b in the widthwise end region Rd of the channel tube 30 face each other. Accordingly, as illustrated in FIGS. 13B and 13C, the top end protrusions 33a of the bend depressions 33 that face each other gradually move closer to each other. Finally, the two top end protrusions 33a are brought into contact with each other. As a result, the top end protrusions 33a of each of the bend depressions 33 that face each other are connected to each other. Thus, a partition wall 330 that partitions the interior of the channel tube 30 in the width direction is formed. The partition wall 330 formed in this manner partitions the internal flow channel 36 of the channel tube 30 in the width direction, and internal flow channels 36a to 36d are formed. Note that as illustrated in FIG. 11, the partition wall 330 is also formed in a corresponding area of the joint end region Ra subjected to the drawing included in the widthwise end region Rd of the channel tube 30. Also note that since the areas of the channel tube 30 corresponding to the widthwise end region Rd and the general region Rb are not subjected to the drawing, the partition wall 330 is not formed.

As described above, in the channel tube 30 according to the present exemplary embodiment, each of the bend depressions 33 that is bent in a concave shape is formed in each of the upper wall 30a and the lower wall 30b serving as the outer peripheral wall of the tube of the channel tube 30 so as to extend in a direction in which the internal flow channel extends. In addition, during the working process, the channel tube 30 is compressed from both sides thereof so that each of the bend depressions 33 is crushed inwardly in the width direction until the width of the joint top end 32a is made to be the same as the width of the insertion port 26 of the tank 20. Accordingly, as illustrated in FIG. 10, the width of the general region Rb of the channel tube 30 is made greater than the width of the insertion port 26 of the tank 20, and the width of the joint top end 32a is made to be the same as the width of the insertion port 26. Thus, according to the radiator 2 of the present exemplary embodiment, the width of the general region Rb of the channel tube 30 may be made greater than the width of the insertion port 26 of the tank 20 without using, for example, an adaptor disposed between the tank 20 and the channel tube 30. In this manner, the radiation area of the radiator 2 may be increased and, thus, the radiation performance of the radiator 2 may be increased. That is, according to the radiator 2 of the present exemplary embodiment, the width of the channel tube 30 joined to the tank 20 may be increased without increasing the number of parts, and a sufficient radiation area may be provided.

In addition, by providing the bend depressions 33 that may easily deform in the width direction of the channel tube 30 in each of the upper wall 30a and the lower wall 30b in advance, the position of a portion that easily deforms during drawing may be controlled. In this manner, deformation of the channel tube occurring at an unexpected position, as illustrated in FIG. 9, may be avoided. That is, deformation of an unexpected portion of the outer peripheral surface of the tube, which is a portion other than the bend depressions 33, in the widthwise end region Rd of the channel tube 30 may be excellently reduced. As a result, when the joint top end 32a of the channel tube 30 is inserted into the insertion port 26 of the tank 20 and is subjected to brazing, the gap between the joint top end 32a and the insertion port 26 may be easily and completely filled with the brazing material. Accordingly, leakage of the cooling fluid out of the tank 20 may be reduced.

Note that according to the present exemplary embodiment, only the joint end region Ra of the channel tube 30 is subjected to drawing. Accordingly, it is sufficient that the bend depressions 33 be provided in at least the joint end region Ra of the entire region of the channel tube 30 in the length direction (the direction in which the internal flow channel extends). By forming the bend depressions 33 in the joint end region Ra so as to extend in the direction in which the internal flow channel 36 extends, the bend depressions 33 may be compression-deformed during drawing and, thus, the width of the bend depression 33 may be appropriately reduced.

In addition, the bend depressions 33 are disposed in each of the upper wall 30a and the lower wall 30b, which serve as outer peripheral surfaces of the tube that face each other with the internal flow channel 36 of the channel tube 30 therebetween. The two bend depressions 33 face each other. In this manner, the width of the joint end region Ra may be reduced with balance during drawing. That is, when the width of the joint end region Ra of the channel tube 30 is reduced, the compressed portion and the amount of compression for the upper wall 30a may be the same as those for the lower wall 30b.

Furthermore, when the bend depressions 33 are crushed by an external force, the two top end protrusions 33a of the bend depressions 33 that are disposed in the upper wall 30a and the lower wall 30b so as to face each other are brought into contact with each other. In this manner, the two top end protrusions 33a of the bend depressions 33 are connected to each other and, thus, the partition wall 330 may be formed. The partition wall 330 may partition the inner space into the internal flow channels 36a to 36d.

Still furthermore, according to the present exemplary embodiment, the bend depression 33 is formed in the widthwise end region Rd, which is an end region of the channel tube 30 in the width direction. Thus, when the channel tube 30 is compressed from both sides through the machining process, an external force for crushing the bend depression 33 may be suitably transferred. As a result, the bend depression 33 may be easily crushed in the width direction of the channel tube 30 and, thus, the width of the channel tube 30 in the joint end region Ra may be easily reduced. Note that to facilitate collapse of the bend depression 33 during drawing, it is sufficient that the bend depression 33 be formed in at least the end region in the width direction of the channel tube 30. The bend depressions 33 may be formed throughout the width of the channel tube 30. However, the position at which the bend depression 33 is formed in the width direction of the channel tube 30 is not limited to the position of the above-described embodiment. Instead of the end region in the width direction, the bend depression 33 may be formed in the middle region in the width direction.

Yet still furthermore, according to the channel tube 30 of the present exemplary embodiment, the bend depression 33 is formed in a substantially V shape in cross section. However, the bend depression 33 may be formed in, for example, a substantially U shape in cross section. By forming the bend depression 33 having a substantially U shape in cross section in the outer peripheral surface of the tube, the bend depression 33 may be easily crushed in the width direction of the channel tube 30 during drawing. As a result, the drawing operation for the channel tube 30 may be facilitated.

Second Exemplary Embodiment

Figure 14:
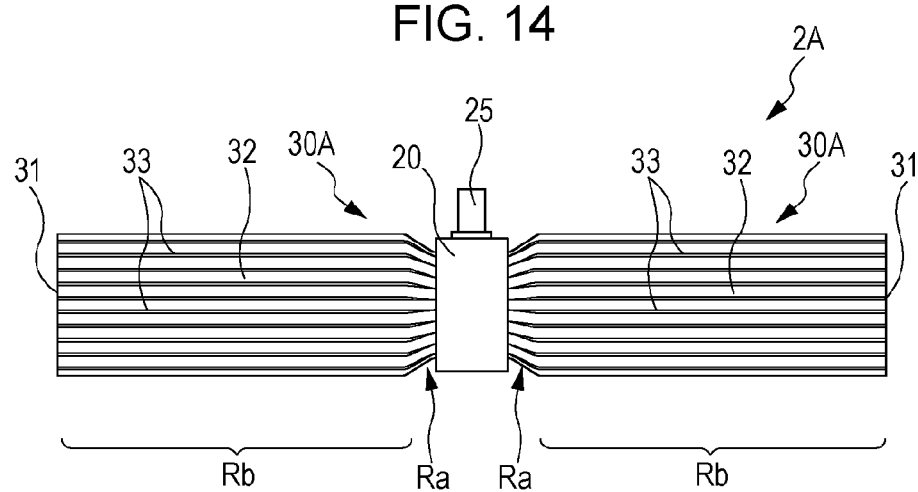
FIG. 14 is a plan view of a radiator according to a second exemplary embodiment.
Figure 15:
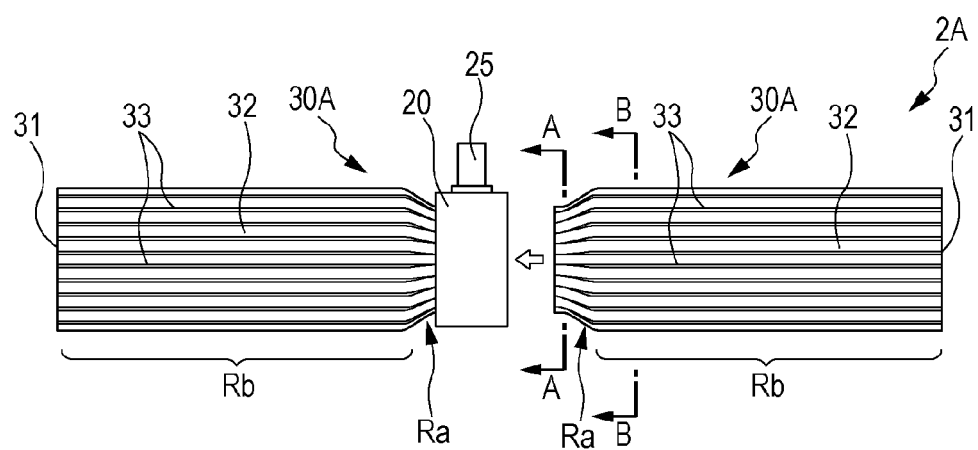
FIG. 15 is an exploded view of the radiator according to the second exemplary embodiment.
Figure 16:
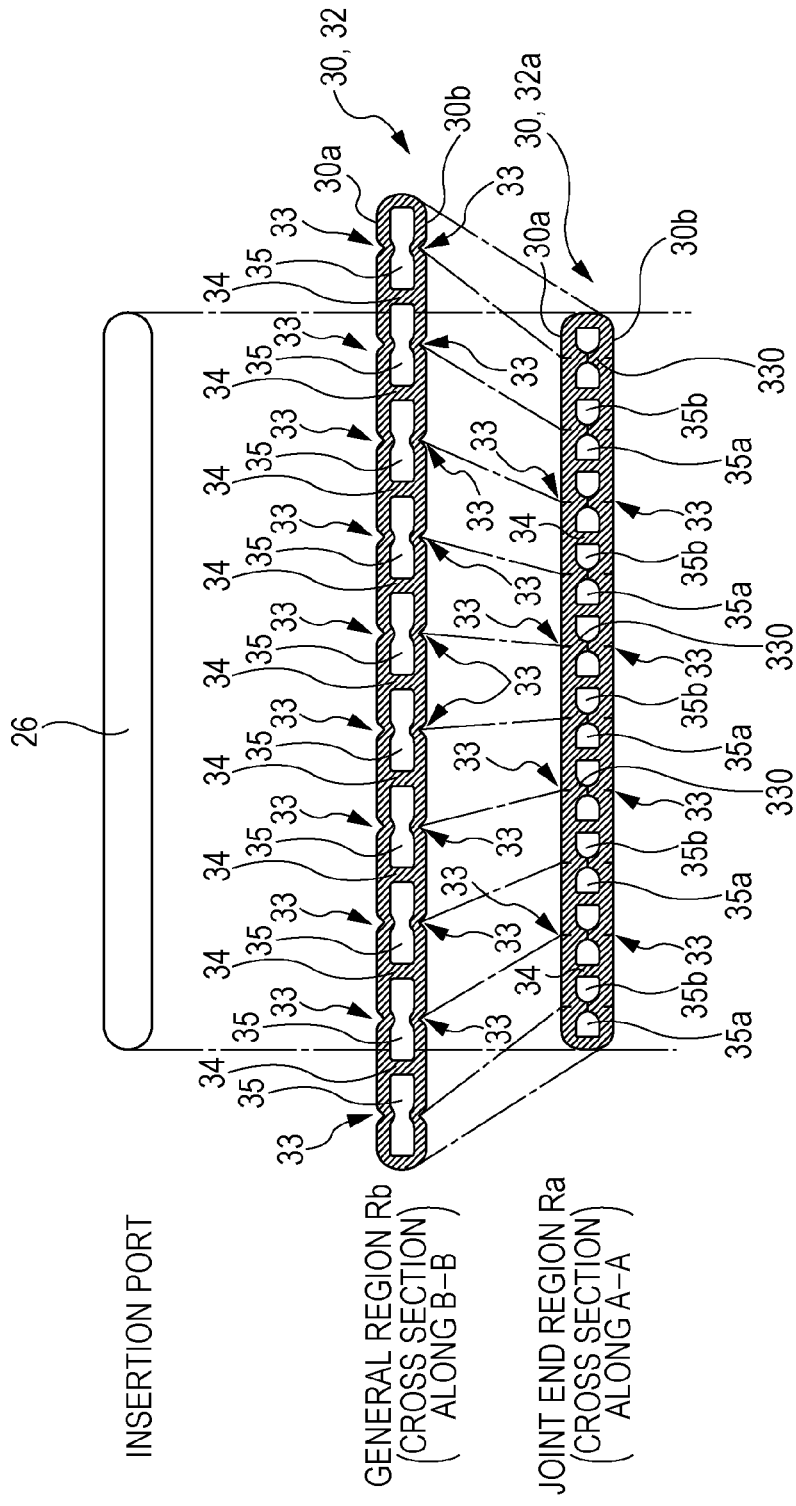
FIG. 16 is a vertical cross-sectional view of a channel tube according to the second exemplary embodiment.
Figure 17:
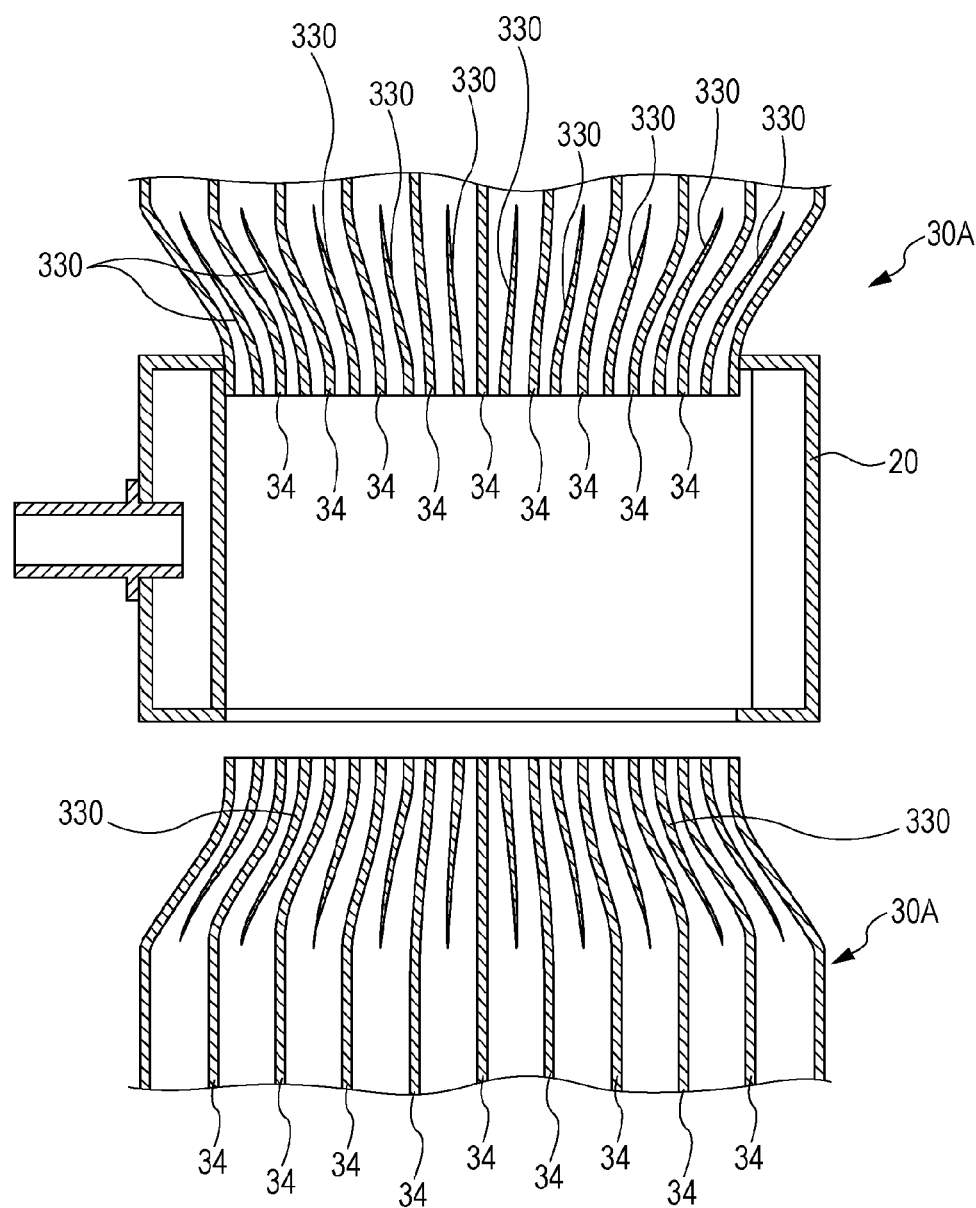
FIG. 17 is a horizontal cross-sectional view of the channel tube according to the second exemplary embodiment.

A radiator 2A according to a second exemplary embodiment is described below. FIG. 14 is a plan view of the radiator 2A according to the second exemplary embodiment. FIG. 15 is an exploded view of the radiator 2A according to the second exemplary embodiment. FIG. 16 is a vertical cross-sectional view of a channel tube 30A according to the second exemplary embodiment. FIG. 17 is a horizontal sectional view of the channel tube 30A according to the second exemplary embodiment. Note that FIGS. 14 to 17 correspond to FIGS. 6, 7, 10, and 11 of the first exemplary embodiment, respectively. The vertical cross-sectional structure of a joint end region Ra taken along line A-A of FIG. 14 is illustrated in the lower section of FIG. 16. The vertical cross-sectional structure of the general region Rb taken along line B-B of FIG. 14 is illustrated in the upper section of FIG. 16. A cross-sectional structure at the height in the middle of the channel tube 30A in the depth or thickness direction is illustrated in FIG. 17.

The channel tube 30A of the radiator 2A according to the second exemplary embodiment differs from the channel tube 30 described above. Hereinafter, differences between the channel tube 30A and the channel tube 30 are mainly described. Like the first exemplary embodiment, the channel tube 30A according to the second exemplary embodiment includes a bend depression 33 that is formed in each of the upper wall 30a and the lower wall 30b of the channel tube 30A and that extend in a direction in which the internal flow channel extends. The bend depression 33 is bent toward the internal flow channel in a concave shape. Unlike the channel tube 30 including the bend depression 33 in the end region in the width direction, the channel tube 30A according to the second exemplary embodiment includes the bend depression 33 across the entire region in the width direction (the entire width region).

As illustrated in FIG. 16, the general region Rb of the channel tube 30A is partitioned into a plurality of internal flow channels 35 by the partition walls 34 that connect the upper wall 30a to the lower wall 30b. In addition, the partition walls 34 are disposed at equal intervals in the width direction of the channel tube 30A and, thus, the flow channel cross-sectional areas of the internal flow channels 35 for the cooling fluid are the same. In addition, the width of the general region Rb of the channel tube 30A is greater than the width of the insertion port 26 of the tank 20.

In addition, as illustrated in FIG. 16, the bend depressions 33 that are adjacent to each other in the width direction of the channel tube 30A are separated by the partition wall 34. That is, the channel tube 30A includes the partition walls 34 and the bend depressions 33 alternately disposed. Furthermore, in each of the upper wall 30a and the lower wall 30b, the bend depression 33 is disposed at a position at the same distance from two adjacent partition walls 34. Like the first exemplary embodiment, according to the second exemplary embodiment, the bend depression 33 in the upper wall 30a and the bend depression 33 in the lower wall 30b are disposed so as to face each other.

Figure 18A:
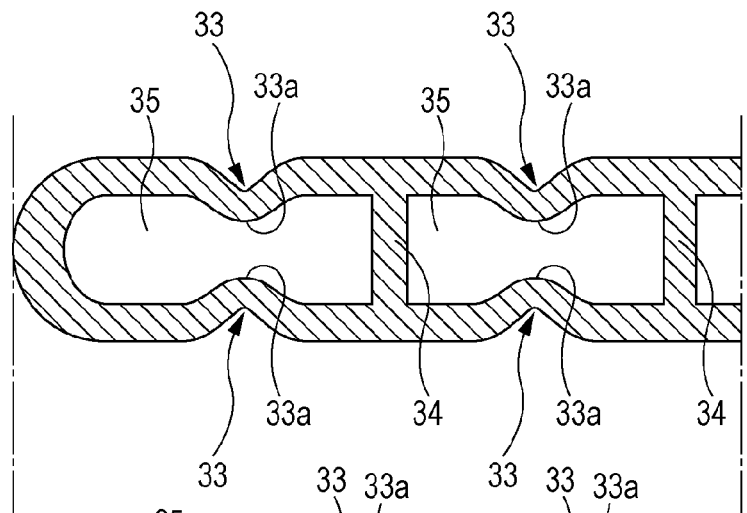
FIGS. 18A to 18C illustrate deformation of the channel tube when the channel tube is subjected to drawing, according to the second exemplary embodiment.
Figure 18B:
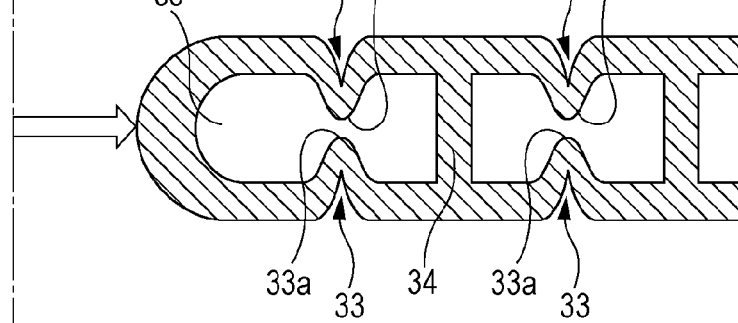
Figure 18C:
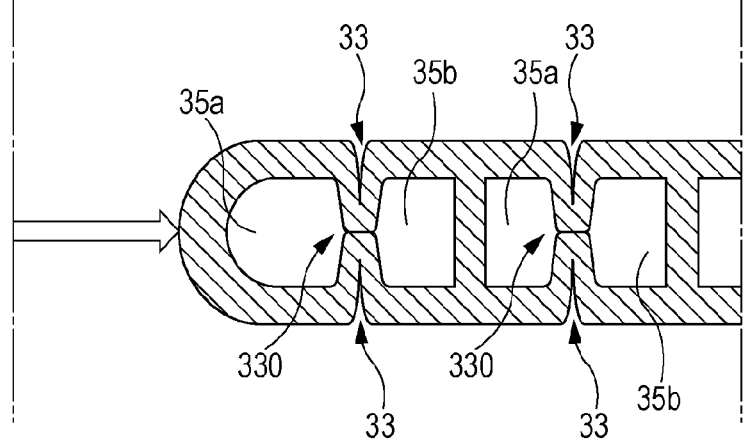

The joint end region Ra of the channel tube 30A is formed by performing a drawing operation on the general region Rb. The width of the joint end region Ra is the same as the width of the insertion port 26 of the tank 20. FIGS. 18A to 18C illustrate deformation of the channel tube 30A when the channel tube 30A according to the second exemplary embodiment is subjected to drawing. More specifically, FIG. 18A illustrates the channel tube 30A before the channel tube 30A is subjected to drawing, FIG. 18B illustrates the channel tube 30A being subjected to drawing, and FIG. 18C illustrates the channel tube 30A after the channel tube 30A is subjected to drawing. When a compressing force is exerted on the channel tube 30A illustrated in FIG. 18A from both sides thereof, the compressing force crushes the bend depressions 33 formed in the upper surface 30a and the lower wall 30b in the width direction of the channel tube 30A. Thus, the joint end region Ra having a width that is less than the width of the general region Rb may be formed.

As the collapse of the bend depressions 33 proceeds in the width direction of the channel tube 30, the top end protrusion 33a is gradually displaced toward the interior of the channel tube 30A, as illustrated in FIG. 18B. As a result, the top end protrusions 33a of the bend depressions 33 that face each other moves closer to each other. Finally, as illustrated in FIG. 18C, the top end protrusions 33a of the bend depressions 33 that face each other are brought into contact with each other and are connected to each other. In this manner, the partition wall 330 is formed. The partition wall 330 formed in this manner partitions (divides) the internal flow channel 35 into two internal flow channels, that is, internal flow channels 35a and 35b.

Like the radiator 2 according to the first exemplary embodiment, in the radiator 2A according to the present exemplary embodiment, the width of the channel tube 30A joined to the tank 20 may be increased without increasing the number of parts and, thus, a sufficient radiation area may be provided. That is, the radiation performance of the radiator 2A may be appropriately increased. In addition, since the flow channel cross sectional areas of the internal flow channels 35 of the channel tube 30A are the same and the bend depression 33 is disposed in the middle of the partition walls 34 that are adjacent to each other, the flow channel cross sectional areas of the internal flow channels 35a and 35b may be made to be the same. In this manner, the amounts of the cooling fluid flowing through the internal flow channels 35a and 35b of the channel tube 30A may be made to be the same. In addition, according to the channel tube 30A of the present exemplary embodiment, since the bend depressions 33 are formed across the full width, the amount of drawn portion in the width direction of the channel tube 30A may be sufficiently obtained. Accordingly, the width of the joint top end 32a of the channel tube 30A may be the same as the width of the insertion port 26, and the width of the general region Rb may be further increased. Thus, the radiation area may be sufficiently provided. In addition, according to the channel tube 30A of the present exemplary embodiment, since the partition walls 34 and the bend depressions 33 are alternately disposed in the width direction of the channel tube 30A, the internal flow channels 35 are not clogged during drawing.

It should be noted that a variety of modifications may be made to the above-described exemplary embodiments without departing the spirit and scope of the present disclosure. In addition, the above-described exemplary embodiments and the modifications may be maximally combined with one another.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radiator comprising:
    a tube that has a flattened shape, the tube including an internal flow channel that allows a coolant to flow through the internal flow channel; and
    a tank that includes an insertion port into which a joint end portion of the tube is inserted so that the tank and the tube are joined to each other,
    wherein the tube includes an outer peripheral wall extending in a direction perpendicular to a thickness direction of the tube, and one or more bend depressions that are bent toward the internal flow channel in a concave shape are formed in at least a region of the outer peripheral wall adjacent to the joint end portion, the one or more bend depressions extending along the internal flow channel,
    wherein the one or more bend depressions are deformed in a width direction of the tube so that the width of the joint end portion is the same as the width of the insertion port,
    wherein the outer peripheral wall includes two of peripheral walls,
    wherein the tube includes a partition wall installation region free of the one or more bend depressions,
    wherein the one or more bend depressions are disposed on opposite sides of the partition wall installation region, and
    wherein the partition wall installation region includes a plurality of walls that connect the two of peripheral walls together.

2. The radiator according to claim 1,
    wherein the bend depressions are disposed in the two of peripheral walls so as to face each other with the internal flow channel between the two of peripheral walls.

3. The radiator according to claim 1,
    wherein each of the two of peripheral walls includes the one or more bend depressions, and two of the bend depressions facing each other includes respective top end protrusions that protrude toward the internal flow channel to form a partition wall by causing the respective top end protrusions to be brought into contact with each other, and
    wherein the internal flow channel is partitioned by the partition wall.

4. The radiator according to claim 2, wherein an integral partition wall integrally formed with the tube is disposed so as to separate the bend depressions arranged in the width direction of the tube.

5. The radiator according to claim 1, wherein the one or more bend depressions are formed at least an end region of the tube in the width direction of the tube.

6. The radiator according to claim 5, wherein the one or more bend depressions are formed across the entire width of the tube.

* * * * *